(12) United States Patent
Park et al.

(10) Patent No.: US 11,054,953 B2
(45) Date of Patent: Jul. 6, 2021

(54) DISPLAY DEVICE WITH INTEGRATED CIRCUITS STACK STRUCTURE

(71) Applicant: SAMSUNG DISPLAY CO., LTD., Yongin-si (KR)

(72) Inventors: Geunjeong Park, Hwaseong-si (KR); Yongjun Jang, Yongin-si (KR); Byungsun Kim, Suwon-si (KR); Ahyoung Son, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 98 days.

(21) Appl. No.: 15/958,449

(22) Filed: Apr. 20, 2018

(65) Prior Publication Data

US 2018/0307369 A1    Oct. 25, 2018

(30) Foreign Application Priority Data

Apr. 21, 2017   (KR) ........................ 10-2017-0051702

(51) Int. Cl.
*G06F 3/044*      (2006.01)
*H05K 1/18*       (2006.01)
(Continued)

(52) U.S. Cl.
CPC .......... *G06F 3/0445* (2019.05); *G06F 3/0412* (2013.01); *G06K 9/0002* (2013.01); *G06K 9/00026* (2013.01); *G06K 9/00067* (2013.01); *H05K 1/189* (2013.01); *H01L 23/5387* (2013.01); *H05K 2201/10128* (2013.01);
(Continued)

(58) Field of Classification Search
CPC ...... G06F 3/0416; G06F 3/0412; G06F 3/044; G06F 3/0445; G06K 9/0002; G06K 9/00026; G06K 9/00067; H05K 2201/10128; H05K 2201/10136; H05K 2201/10166; H05K 1/189; H01L 23/5387; G09F 9/301; G09F 9/33

See application file for complete search history.

(56) References Cited

U.S. PATENT DOCUMENTS 9,285,835 B2    3/2016 Lee et al.
9,349,035 B1*   5/2016 Gerber ............... G06K 9/00013
(Continued)

FOREIGN PATENT DOCUMENTS

CN    104021734    9/2014
CN    104050884    9/2014
(Continued)

OTHER PUBLICATIONS

European search Report issued in corresponding application No. 18168609.8 dated Sep. 21, 2018.

*Primary Examiner* — Temesghen Ghebretinsae
*Assistant Examiner* — Ivelisse Martinez Quiles
(74) *Attorney, Agent, or Firm* — F. Chau & Associates, LLC

(57) ABSTRACT

A display device includes: a display panel including a display area in which a plurality of pixels are arranged to display images and a non-display area around the display area. A flexible printed circuit board is connected to the display panel and a driving integrated circuit is arranged on the flexible printed circuit board. A home integrated circuit is arranged on the driving integrated circuit and overlapping the driving integrated circuit.

13 Claims, 9 Drawing Sheets

(51) Int. Cl.
  *G06F 3/041* (2006.01)
  *G06K 9/00* (2006.01)
  *H01L 23/538* (2006.01)
(52) U.S. Cl.
  CPC .............. *H05K 2201/10136* (2013.01); *H05K 2201/10166* (2013.01)

(56) References Cited

U.S. PATENT DOCUMENTS

| | | | |
|---|---|---|---|
| 9,349,969 B2 | 5/2016 | Kwon et al. | |
| 10,080,281 B2 | 9/2018 | Jung et al. | |
| 10,114,498 B2 | 10/2018 | Ahn | |
| 2002/0167081 A1* | 11/2002 | Kondo | H01L 23/5382 257/686 |
| 2007/0105304 A1* | 5/2007 | Kasai | H01L 25/0657 438/254 |
| 2012/0038045 A1* | 2/2012 | Lee | H01L 23/481 257/738 |
| 2012/0044636 A1 | 2/2012 | Rothkopf et al. | |
| 2013/0076704 A1 | 3/2013 | Song et al. | |
| 2013/0119558 A1* | 5/2013 | Hwang | H01L 23/5387 257/774 |
| 2013/0279769 A1* | 10/2013 | Benkley, III | G06K 9/00013 382/124 |
| 2014/0124956 A1* | 5/2014 | Lee | H01L 24/17 |
| 2016/0217310 A1 | 7/2016 | Shah et al. | |
| 2016/0253540 A1* | 9/2016 | Han | G06K 9/00 382/124 |
| 2017/0115817 A1 | 4/2017 | Kim et al. | |
| 2017/0220838 A1* | 8/2017 | He | G06K 9/0004 |
| 2017/0220844 A1* | 8/2017 | Jones | G06K 9/0053 |
| 2017/0344787 A1* | 11/2017 | Cho | G06F 3/0416 |
| 2020/0053874 A1 | 2/2020 | Eom et al. | |

FOREIGN PATENT DOCUMENTS

| | | |
|---|---|---|
| CN | 105009188 | 10/2015 |
| CN | 105632344 | 6/2016 |
| CN | 105825773 | 8/2016 |
| KR | 10-2014-0142370 | 12/2014 |
| KR | 10-2015-0042625 | 4/2015 |
| KR | 10-2016-0122514 | 10/2016 |

* cited by examiner

DISPLAY DEVICE WITH INTEGRATED CIRCUITS STACK STRUCTURE

CROSS-REFERENCE TO RELATED APPLICATION

This application claims priority under 35 U.S.C. § 119 from Korean Patent Application No. 10-2017-0051702, filed on Apr. 21, 2017 in the Korean Intellectual Property Office (KIPO), the disclosure of which is incorporated by reference herein in its entirety.

TECHNICAL FIELD

Embodiments of the inventive concept relate to a display device, and more particularly, to a display device including a narrow bezel.

DISCUSSION OF RELATED ART

Display devices may be classified into liquid crystal display ("LCD") devices, organic light emitting diode ("OLED") display devices, plasma display panel ("PDP") devices, electrophoretic display devices, and the like based on a respective light emitting scheme thereof.

The display device includes a display area in which a plurality of pixels for displaying images are disposed and a non-display area around the display area. A configuration of a display device may include one or more of a home button, a camera, a speaker, a microphone, and the like, which may be disposed at the non-display area of the display device.

Recently, efforts have been undertaken to minimize a size of the non-display area, whereby the configuration of items such as a home button, a camera, a speaker, a microphone, and the like, which conventionally are disposed at the non-display area, are omitted or are disposed at the display area.

It is to be understood by a person of ordinary skill in the art that this discussion of the related art is intended to provide a discussion of the related art for understanding some of the technology as disclosed herein. The discussion of the technology of the related art may include ideas, concepts or recognitions that were not part of what was known or appreciated by those skilled in the art prior to a corresponding effective filing date of the subject matter disclosed herein.

SUMMARY

Embodiments of the inventive concept may be directed to a display device in which a home area which functions as a home button is formed in a display area.

According to an exemplary embodiment of the inventive concept, a display device may include: a display panel having a display area in which a plurality of pixels are arranged to display images and a non-display area around the display area; a flexible printed circuit board connected to the display panel; a driving integrated circuit disposed on the flexible printed circuit board; and a home integrated circuit disposed on the driving integrated circuit and overlapping the driving integrated circuit.

The home integrated circuit and the driving integrated circuit may form a stacked structure on the flexible printed circuit board.

The home integrated circuit may be electrically connected to the driving integrated circuit.

The home integrated circuit may overlap the display area on a plane of the display area.

The display panel may include a home area in the display area.

The home integrated circuit may overlap the home area on a plane.

The home area may be formed at an arbitrary area of the display device.

At least a portion of the home integrated circuit may overlap the home area.

The home integrated circuit may include at least one of a touch recognition integrated circuit and a fingerprint recognition integrated circuit.

The home integrated circuit may be in contact with a back surface of the display panel.

The home integrated circuit may overlap the driving integrated circuit on a plane.

The home integrated circuit may be electrically connected to the driving integrated circuit through a via hole.

The home integrated circuit may have a planar area larger than a planar area of the driving integrated circuit on a plane.

The home integrated circuit may have a planar area substantially equal to a planar area of the driving integrated circuit on a plane. The display device may further include an adhesive member between the driving integrated circuit and the home integrated circuit.

The adhesive member may include a conductive material.

The adhesive member may be an anisotropic conductive film (ACF).

The driving integrated circuit and the home integrated circuit may be unitarily packaged.

The home area may have a shape one of a substantially quadrangular shape, a substantially triangular shape, a substantially rhombic shape, a substantially circular shape, a substantially elliptical shape, a substantially semicircular shape, a substantially polygonal shape, and a substantially combined shape thereof.

The foregoing is illustrative only and does not limit the scope of the embodiments of inventive concept and the appended claims. A person of ordinary skill in the art will better appreciate the embodiments of the inventive concept by reference to the drawings and the following detailed description.

BRIEF DESCRIPTION OF THE DRAWINGS

A more complete appreciation of the embodiments of the inventive concept will become more apparent by describing in detail exemplary embodiments thereof with reference to the accompanying drawings, wherein.

DETAILED DESCRIPTION

Figure 1:
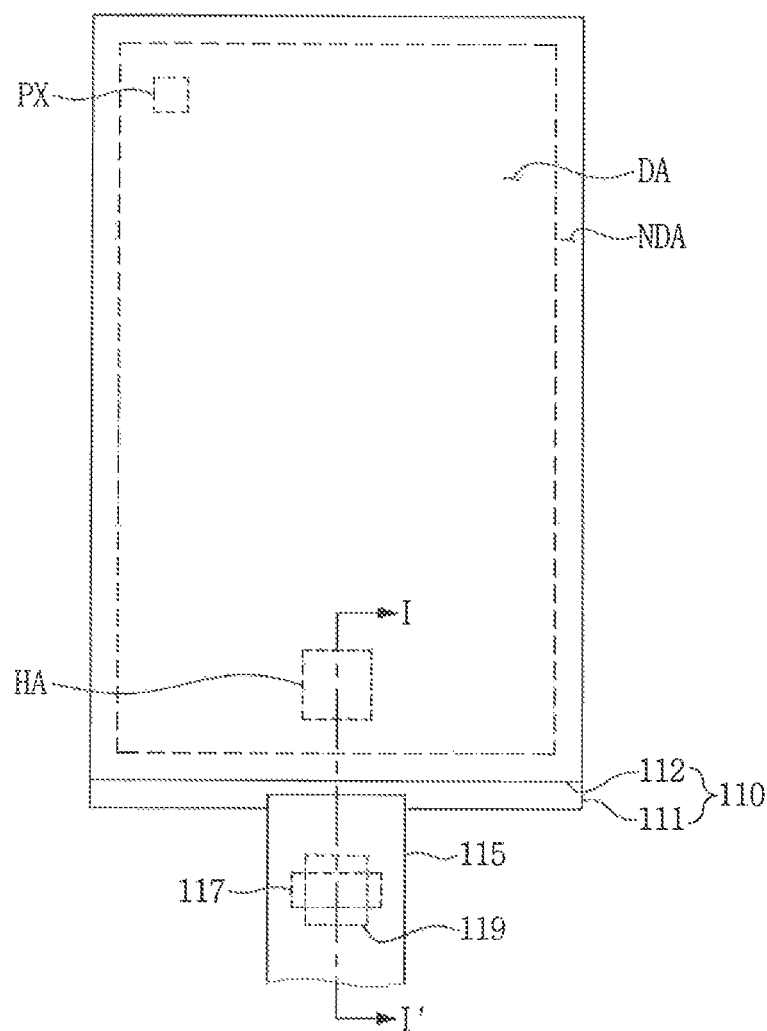
FIG. 1 is a plan view illustrating a display device according to an exemplary embodiment of the inventive concept.

Exemplary embodiments of the inventive concept will now be described more fully hereinafter with reference to the accompanying drawings. Although the embodiments of the inventive concept may be modified in various manners and have several exemplary embodiments, exemplary embodiments are illustrated in the accompanying drawings and will be mainly described in the specification. However, the scope of the embodiments of the inventive concept is not limited to the exemplary embodiments and should be construed as including all the changes, equivalents and substitutions included in the spirit and scope of the appended claims.

In the drawings, thicknesses of a plurality of layers and areas are illustrated in an enlarged manner for clarity and ease of description thereof. When a layer, area, or plate is referred to as being "on" another layer, area, or plate, the layer, area, or plate may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, a person of ordinary skill in the art should understand and appreciate that "below" may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may be defined as being within one or more standard deviations, or within ±30%, 20%, 10%, 5% of the stated value.

Unless otherwise defined, all terms used herein (including technical and scientific terms) have the same meaning as commonly understood by those skilled in the art to which embodiments of the inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the embodiments of the inventive concept may not be provided in this disclosure so as not to obscure an artisan's appreciation of the embodiments of the inventive concept. In addition, like reference numerals refer to like elements throughout the specification.

Figure 2:
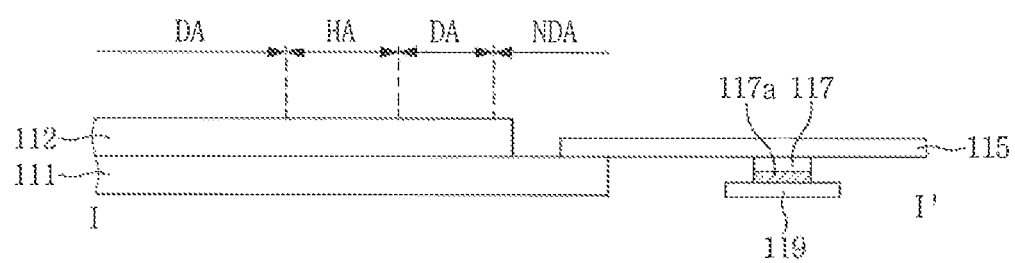
FIG. 2 is a cross-sectional view taken along the line of FIG. 1.
Figure 3:
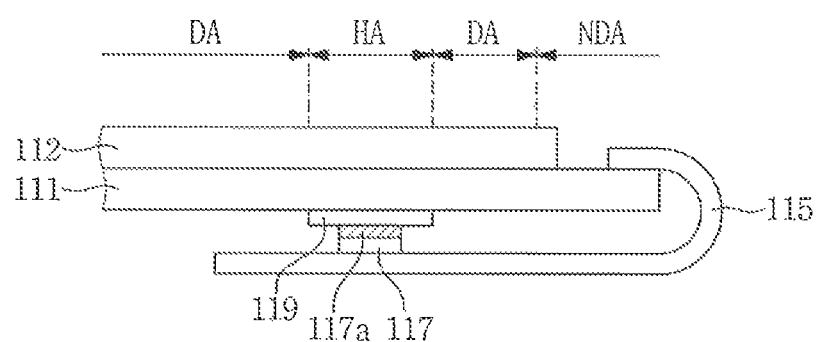
FIG. 3 is a cross-sectional view illustrating an assembled state of a display device according to an exemplary embodiment of the inventive concept.

FIG. 1 is a plan view illustrating a display device according to an exemplary embodiment of the inventive concept, FIG. 2 is a cross-sectional view taken along the line I-I' of FIG. 1, and FIG. 3 is a cross-sectional view illustrating an assembled state of a display device according to an exemplary embodiment of the inventive concept.

Referring to FIGS. 1, 2, and 3, a display device according to an exemplary embodiment of the inventive concept includes a display panel 110 which includes a display area DA in which a plurality of pixels PX are disposed to display images, and a non-display area NDA surrounding the display area DA. A flexible printed circuit board 115 is electrically connected to the display panel 110. A driving integrated circuit ("IC") 117 is mounted on the flexible printed circuit board 115. A home IC 119 is arranged on the driving IC 117, and the like.

The display panel 110 according to an exemplary embodiment of the inventive concept may include one of a liquid crystal display ("LCD") panel, an organic light emitting diode ("OLED") display panel, a plasma display panel ("PDP"), and an electrophoretic display panel.

Hereinafter, the display panel 110 according to an exemplary embodiment of the inventive concept will be assumed to be an OLED display panel for ease of description.

The display panel 110 may include a plurality of pixels PX arranged in a matrix form. A more detailed configuration of the pixel PX will be described below.

The display panel 110 may include a home area HA in the display area DA. In FIG. 1, the home area HA is depicted as being located at a center portion of one edge portion of the display area DA, but exemplary embodiments of the inventive concept are not limited thereto. The home area HA may be located at an arbitrary area within the display area DA.

In addition, a size of the home area HA is not limited to any ratio of the display area DA as shown, and a shape of the home area HA may be, for example, a substantially quadrangular shape, a substantially triangular shape, a substantially rhombic shape, a substantially circular shape, a substantially elliptical shape, a substantially semicircular shape, a substantially polygonal shape, and/or a shape substantially combined of at least two of the aforementioned shapes.

In addition, although one home area HA is shown in FIG. 1, exemplary embodiments substantially are not limited thereto, and the display area DA may include more than one home area HA. The home area HA may be divided into sub-home areas.

The home area HA may is configured to control operation of one or more functions in a substantially similar manner as a function of a home button arranged in a conventional non-display area NDA. For example, a display device activation and deactivation function, a fingerprint recognition function, and the like may be performed at the home area HA. The functions may be performed by the home IC 119 which is located on a back surface of the display panel 110 and arranged to overlap the home area HA.

The display panel 110 may include a first substrate 111 and a second substrate 112 which oppose each other.

The display panel 110 may include a plurality of thin film transistors arranged in a matrix on the first substrate 111, an organic light emitting element connected to each thin film transistor, and various signal lines for driving the thin film transistors.

The flexible printed circuit board 115 may overlap a portion of the first substrate 111 to be electrically connected thereto. The flexible printed circuit board 115 may be, for example, a chip-on-film (COP) or a tape carrier package (TCP). Hereinafter, it is assumed that the flexible printed circuit board 115 is a COF. FIG. 1 illustrates a single flexible printed circuit board 115, but exemplary embodiments of the inventive concept are not limited thereto. The number of flexible printed circuit boards 115 may vary depending on a size of the display panel, a driving scheme, and the like.

The driving IC 117 may be mounted on the flexible printed circuit board 115. The driving IC 117 may generate various driving signals for driving the display panel 110. The driving IC 117 may include a timing controller and a data driving circuit which are integrated into one chip, and thus the driving IC 117 may be expressed as a driver IC or a source IC.

In FIGS. 1, 2, and 3, the driving IC 117 is depicted as being mounted on the back surface of the flexible printed circuit board 115, but exemplary embodiments of the inventive concept are not limited thereto. The driving IC 117 may be mounted on an upper surface of the flexible printed circuit board 115.

The home IC 119 may be disposed on the driving IC 117. The home IC 119 may have a touch recognition function for activating or deactivating the display device and a fingerprint recognition function for recognizing a fingerprint of a display device user.

At least a portion of the home IC 119 may be arranged so as to overlap the driving IC 117 on a plane. An adhesive member 117a may be disposed between the driving IC 117 and the home IC 119 to fix the driving IC 117 and the home IC 119. The adhesive member 117a may include a conductive material. For example, the adhesive member 117a may be an anisotropic conductive film (ACF).

In the display device according to an exemplary embodiment of the inventive concept, since the driving IC 117 and the home IC 119 are arranged to overlap each other on a plane, the space utilization in the display device may be increased. For example, by forming the driving IC 117 and the home IC 119 in a stack structure, a planar area occupied by the driving IC 117 and the home IC 119 in the flexible printed circuit board 115 may be reduced.

In addition, the home IC 119 according to an exemplary embodiment of the inventive concept may be arranged so as to overlap the home area HA of the display panel 110, and may perform the above functions at the home area HA.

Referring to FIG. 3, in a display device assembly process, the flexible printed circuit board 115 is bent along a side surface of the display panel 110 to be positioned on a back surface of the display panel 110. Since the driving IC 117 and the home IC 119 are disposed on the back surface of the flexible printed circuit board 115, when the flexible printed circuit board 115 is bent, the home IC 119 may be disposed to contact the back surface of the display panel 110. Accordingly, the structure of the display device may include the home IC 119 being arranged so that at least a portion thereof overlaps the home area HA.

Figure 4:
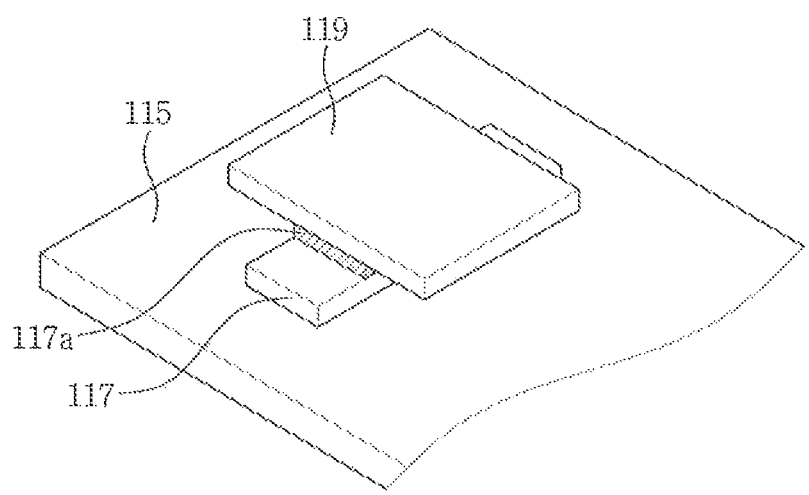
FIG. 4 is a perspective view illustrating a driving integrated circuit (IC) and a home IC according to an exemplary embodiment of the inventive concept.
Figure 5:
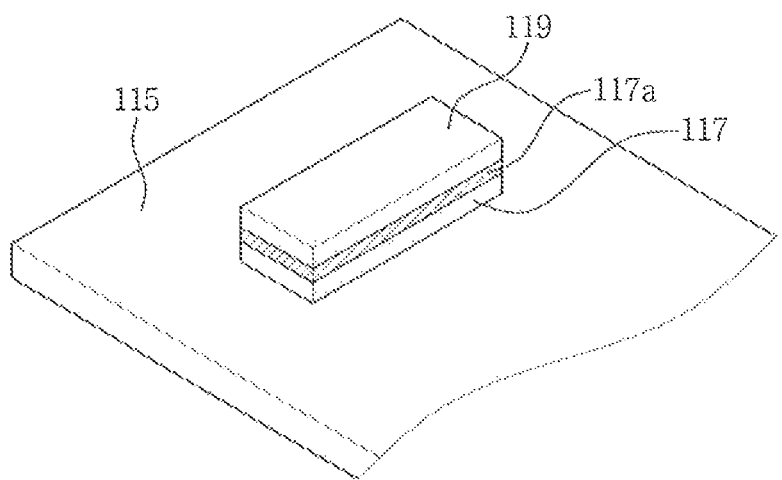
FIG. 5 is a perspective view illustrating a driving IC and a home IC according to another exemplary embodiment of the inventive concept.
Figure 6:
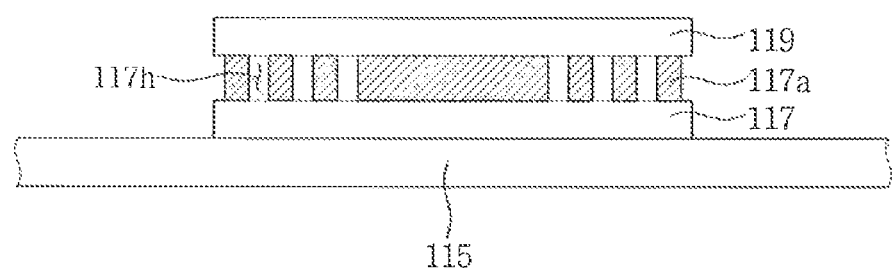
FIG. 6 is a cross-sectional view illustrating a driving IC and a home IC according to another exemplary embodiment of the inventive concept.

FIG. 4 is a perspective view illustrating a driving IC and a home IC according to an exemplary embodiment of the inventive concept, and FIG. 5 is a perspective view illustrating a driving IC and a home IC according to another exemplary embodiment of the inventive concept, and FIG. 6 is a cross-sectional view illustrating a driving IC and a home IC according to another exemplary embodiment of the inventive concept.

The home IC 119 according to an exemplary embodiment of the inventive concept may be disposed on the driving IC 117 to form a stack structure together with the driving IC 117. The adhesive member 117a may be disposed between the driving IC 117 and the home IC 119.

Referring now to FIG. 4, at least a portion of the home IC 119 may overlap the driving IC 117, and the home IC 119 may have a planar area larger than that of the driving IC 117 on a plane.

Referring to FIG. 5, the home IC 119 may be formed to have a planar area substantially equal to that of the driving IC 117 on a plane.

Referring to FIG. 6, the driving IC 117 and the home IC 119 may be electrically connected to each other through at least one via hole 117h. Using the via hole 117h, a sensing signal detected by the home IC 119 may be transmitted to the driving IC 117 or a signal of the driving IC 117 may be transmitted to the home IC 119. In addition, the driving IC 117 and the home IC 119 according to an alternative exemplary embodiment of the inventive concept may be packaged into a unitary structure.

Figure 7:
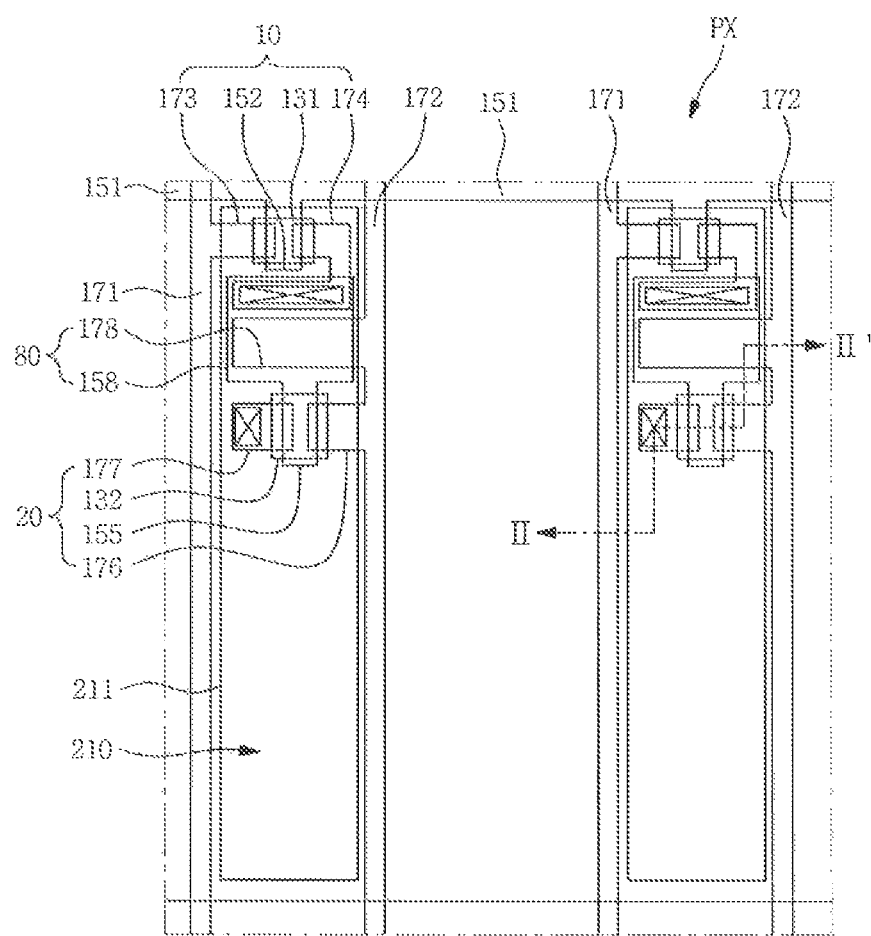
FIG. 7 is a partial enlarged view illustrating a pixel area of FIG. 1.
Figure 8:
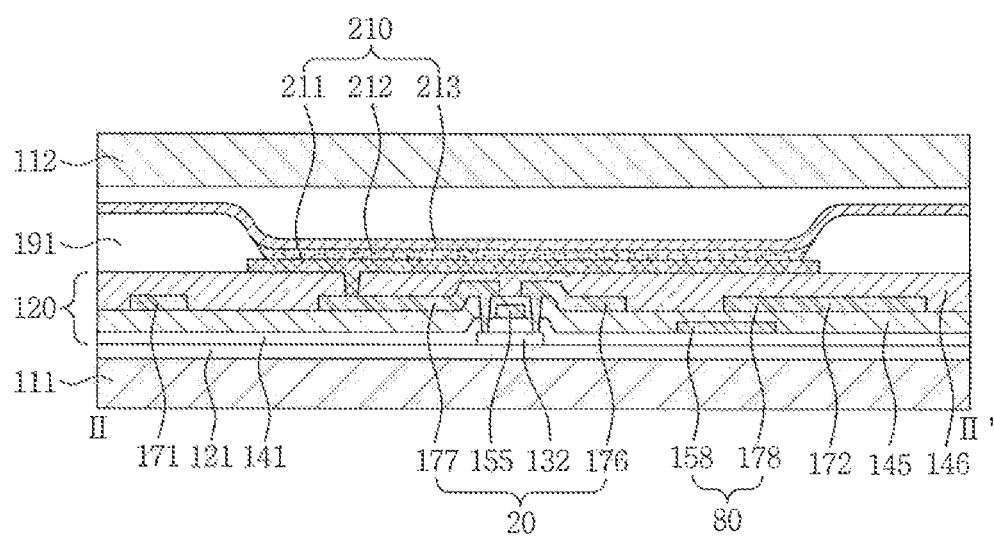
FIG. 8 is a cross-sectional view taken along the line II-II' of FIG. 7.
Figure 9:
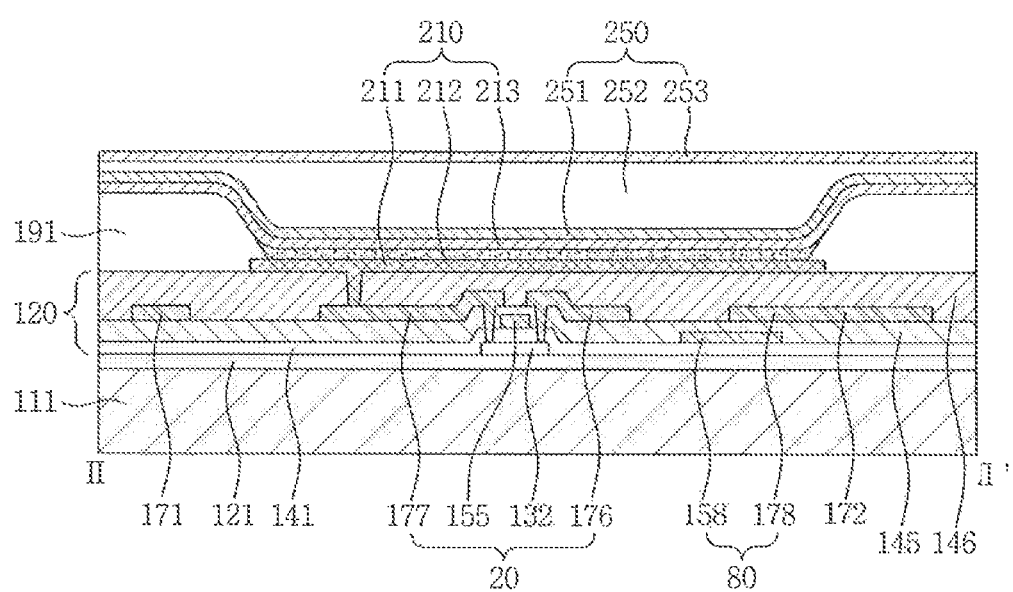
FIG. 9 is a cross-sectional view illustrating a display panel according to an exemplary embodiment of the inventive concept.

FIG. 7 is a partial enlarged view illustrating a pixel area of FIG. 1, FIG. 8 is a cross-sectional view taken along the line II-II' of FIG. 7, and FIG. 9 is a cross-sectional view illustrating a display panel according to another exemplary embodiment of the inventive concept.

Referring now to FIGS. 7 and 8, a pixel PX according to an exemplary embodiment of the inventive concept includes a first substrate 111, a wiring portion 120, an COED 210, and a second substrate 112.

The first substrate 111 may include an insulating material selected from the group consisting of: glass, quartz, ceramic, plastic, and the like. However, exemplary embodiments of the inventive concept are not limited thereto, and the first substrate 111 according to an exemplary embodiment may include a metallic material such as stainless steel.

A buffer layer 121 is disposed on the first substrate 111. The buffer layer 121 may include one or more layers selected from various inorganic layers and organic layers.

The buffer layer 121 serves to substantially prevent permeation of undesirable elements, such as moisture, into the wiring portion 120 or the OLED 210, and to planarize a surface there below. However, the buffer layer 121 may be omitted from the construction shown in FIGS. 7 and 8.

The wiring portion 120 is disposed on the buffer layer 121. The wiring portion 120 is a part including a switching thin film transistor ("TFT") 10, a driving TFT 20 and a capacitor 80, and drives the OLED 210. The OLED 210 emits light according to a driving signal received from the wiring portion 120 to display images.

FIG. 7 illustrates an active matrix-type organic light emitting diode (AMOLED) display panel having a 2Tr-1Cap structure. For example, the 2Tr-1Cap structure may include two TFTs, e.g., the switching TFT 10 and the driving TFT 20, and one capacitor 80 in each pixel PX.

However, exemplary embodiments of the inventive concept are not limited thereto. For example, the OLED display panel may include three or more TFTs and two or more capacitors in each pixel, and may have various structures further including additional wirings. Herein, the term "pixel" refers to a smallest unit for displaying images, and the OLED display panel displays images using the plurality of pixels.

Each pixel PX includes the switching TFT 10, the driving TFT 20, the capacitor 80, and the OLED 210. In addition, a gate line 151 disposed along one direction, and a data line 171 and a common power line 172 insulated from and intersecting the gate line 151 are also disposed at the wiring portion 120. Each pixel PX may be defined by the gate line 151, the data line 171, and the common power line 172, in which they become a boundary, but exemplary embodiments are not limited thereto. The pixels PX may be defined by pixel defining layer or a black matrix.

The OLED 210 includes a first electrode 211, an organic light emitting layer 212 on the first electrode 211, and a second electrode 213 on the organic light emitting layer 212. Holes and electrons are injected into the organic light emitting layer 212 from the first electrode 211 and the second electrode 213, respectively, and combined therein to form an exciton. Light emission occurs when the exciton falls from an excited state to a ground state.

The capacitor 80 includes a pair of capacitor plates 158 and 178, having an insulating interlayer 145 interposed therebetween. In this exemplary embodiment of the inventive concept, the insulating interlayer 145 may be a dielectric element. A capacitance of the capacitor 80 is determined by electric charges accumulated in the capacitor 80 and a voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. The semiconductor layers 131 and 132 and the gate electrodes 152 and 155 are insulated by a gate insulating layer 141.

The switching TFT 10 may function as a switching element which selects a pixel PX to perform light emission. The switching gate electrode 152 is connected to the gate line 151, and the switching source electrode 173 is connected to the data line 171. Spaced apart from the switching source electrode 173, the switching drain electrode 174 is connected to one of the capacitor plates, e.g., the capacitor plate 158.

The driving TFT 20 applies a driving power, which allows the organic light emitting layer 212 of the OLED 210 in a selected pixel PX to emit light, to the first electrode 211 which is a pixel electrode. The driving gate electrode 155 is connected to the one capacitor plate 158 that is connected to the switching drain electrode 174. Each of the driving source electrode 176 and the other of the capacitor plates, e.g., the capacitor plate 178, is connected to the common power line 172. The driving drain electrode 177 is connected to the first electrode 211 of the OLED 210 through a contact hole.

With the structure described above, the switching TFT 10 is driven by a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 210 through the driving TFT 20 such that the OLED 210 may emit light.

In an exemplary embodiment of the inventive concept, the first electrode 211 is an anode for injecting holes, and the second electrode 213 is a cathode for injecting electrons. However, exemplary embodiments of the inventive concept are not limited thereto, and the first electrode 211 may be a cathode and the second electrode 213 may be an anode.

The planarization layer 146 is disposed on the insulating interlayer 145. The planarization layer 146 may include an insulating material, and protect the wiring portion 120. The planarization layer 146 and the insulating interlayer 145 may include a substantially same material.

The driving drain electrode 177 of the driving TFT 20 is connected to the first electrode 211 of the OLED 210 through a contact hole defined at the planarization layer 146.

The first electrode 211 is a reflective electrode, and the second electrode 213 is a transflective electrode. Accordingly, a light generated in the organic light emitting layer 212 is emitted through the second electrode 213. For example, the OLED display device according to an exemplary embodiment of the inventive concept has a top emission type structure.

One or more metals of magnesium (Mg), silver (Ag), gold (Au), calcium (Ca), lithium (Li), chromium (Cr), aluminum (Al), copper (Cu), and an alloy thereof may be used to form the reflective electrode and the transflective electrode. In such an exemplary embodiment, whether the electrode is a reflective type or a transflective type may depend on a thickness of the electrode used. In general, the transflective electrode has a thickness of about 200 nm or less. As the thickness of the transflective electrode decreases, the light transmittance may increase, and as the thickness thereof increases, the light transmittance may decrease.

For example, the first electrode 211 may include a reflective layer including one or more metals of magnesium (Mg), silver (Ag), gold (Au), calcium (Ca), lithium (Li), chromium (Cr), aluminum (Al), and copper (Cu), and a transparent conductive layer on the reflective layer. In such an exemplary embodiment, the transparent conductive layer may include a transparent conductive oxide (TCO). Examples of TCO may include: indium tin oxide (ITO), indium zinc oxide (IZO), zinc oxide (ZnO), aluminum zinc oxide (AZO) and indium oxide ($In_2O_3$). Since such a transparent conductive layer has a high work function, hole injection through the first electrode 211 may be smoothly performed.

In addition, the first electrode 211 may have a triple-layer structure in which a transparent conductive layer, a reflective layer and a transparent conductive layer are sequentially stacked.

The second electrode 213 may include a transflective layer including one or more metals of magnesium (Mg), silver (Ag), gold (Au), calcium (Ca), lithium (Li), chromium (Cr), aluminum (Al), and copper (Cu).

Although not illustrated, at least one of a hole injection layer (HIL) and a hole transporting layer may further be disposed between the first electrode 211 and the organic light emitting layer 212. In addition, at least one of an electron transporting layer (ETL) and an electron injection layer (EIL) may further be disposed between the organic light emitting layer 212 and the second electrode 213.

The organic light emitting layer 212, the HIL, the HTL, the ETL, and the EIL may be collectively referred to as an organic layer. Such an organic layer may include a low molecular weight organic material or a high molecular weight organic material.

A pixel defining layer 191 has an opening. The opening of the pixel defining layer 191 exposes a portion of the first electrode 211. The first electrode 211, the organic light emitting layer 212, and the second electrode 213 are sequentially stacked at the opening of the pixel defining layer 191. The second electrode 213 is disposed on the organic light emitting layer 212 and also on the pixel defining layer 191. The OLED 210 generates a light in the organic light emitting layer 212 located at the opening of the pixel defining layer 191. In such a manner, the pixel defining layer 191 may define a light emitting area.

Although not illustrated, a capping layer may be disposed on the second electrode 213. The capping layer protects the OLED 210.

To protect the OLED 210, the second substrate 112 may be disposed on the OLED 210 to oppose the first substrate 111. The second substrate 112 may include a material substantially the same as a material included in the first substrate 111.

Hereinafter, a display panel according to another exemplary embodiment of the inventive concept will be described with reference to FIG. 9. The display panel according to the another exemplary embodiment is an OLED display panel and includes a thin film encapsulation layer 250 on the OLED 210.

The thin film encapsulation layer 250 includes one or more inorganic layers 251 and 253 and an organic layer 252. The thin film encapsulation layer 250 has a structure in which the inorganic layers 251 and 253 and the organic layer 252 are alternately stacked. According to another alternative exemplary embodiment of the inventive concept, the inorganic layer 251 is disposed at a lowermost portion. For example, the inorganic layer 251 is disposed most adjacent to the OLED 210.

The inorganic layers 251 and 253 include one or more inorganic materials of: $Al_2O_3$, $TiO_2$, $ZrO$, $SiO_2$, $AlON$, $AlN$, $SiON$, $Si_3N_4$, $ZnO$, and $Ta_2O_5$. The inorganic layers 251 and 253 may be formed through methods such as a chemical vapor deposition (CVD) method or an atomic layer deposition (ALD) method.

The organic layer 252 may include a polymer-based material. Examples of the polymer-based material may include, for example, an acrylic resin, an epoxy resin, polyimide and polyethylene. The organic layer 252 may be formed through a thermal deposition process. The thermal deposition process for forming the organic layer 252 may be performed in a range of temperature that may not damage the OLED 210.

The inorganic layers 251 and 253 which have a high density of thin film may substantially prevent or efficiently reduce infiltration of, mostly, moisture or oxygen. Permeation of moisture and oxygen into the OLED 210 may be largely prevented by the inorganic layers 251 and 253.

Moisture and oxygen that may pass through the inorganic layers 251 and 253 may further be blocked by the organic layer 252. The organic layer 252 has relatively low permeation preventing efficiency, as compared to the inorganic layers 251 and 253. However, the organic layer 252 may also serve as a buffer layer to reduce stress between each of the inorganic layers 251 and 253, in addition to the moisture permeation preventing function. In addition, since the organic layer 252 has planarizing characteristics, an uppermost surface of the thin film encapsulation layer 250 may be planarized by the organic layer 252.

The thin film encapsulation layer 250 may have a thickness less than or equal to about 10 μm. Accordingly, an overall thickness of the OLED display device may become significantly small.

When the thin film encapsulation layer 250 is disposed on the OLED 210, the second substrate 112 may be omitted. When the second substrate 112 is omitted, flexible properties of the display panel may be increased.

As set forth hereinabove, according to one or more exemplary embodiments of the inventive concept, the display device may increase the space utilization therein by forming a driving IC for driving a plurality of pixels to overlap a home IC for driving a home area.

According to one or more exemplary embodiments of the inventive concept, the display device may substantially minimize a non-display area by omitting a home button which is conventionally disposed at a non-display area.

In the display device according to one or more exemplary embodiments of the inventive concept, a home area is formed in a display area.

While the embodiments of the inventive concept have been illustrated and described with reference to the exemplary embodiments thereof, it will be apparent to those of ordinary skill in the art that various changes in form and detail may be formed thereto without departing from the spirit and scope of the appended claims.

What is claimed is:

1. A display device comprising:
    a display panel including a display area in which a plurality of pixels are arranged to display images and a non-display area around a periphery of the display area;
    a flexible printed circuit board connected to the display panel;
    a driving integrated circuit mounted on the flexible printed circuit board;
    a home integrated circuit disposed on the driving integrated circuit, wherein the home integrated circuit and the driving integrated circuit are vertically stacked on each other to form a stack structure on the flexible printed circuit board; and
    an adhesive member arranged between the driving integrated circuit and the home integrated circuit,
    wherein the adhesive member is in contact with an upper surface of the driving integrated circuit and a bottom surface of the home integrated circuit,
    wherein the adhesive member has a plurality of via holes,
    wherein the home integrated circuit is electrically connected to the driving integrated circuit through the plurality of via holes,
    wherein the flexible printed circuit board is bent toward a side surface of the display panel such that the stack structure of the home integrated circuit and the driving integrated circuit is confined within a region of the flexible printed circuit board, and wherein the region of the flexible printed circuit board vertically overlaps a home area of the display area.

2. The display device of claim 1, wherein the home integrated circuit is electrically connected to the driving integrated circuit.

3. The display device of claim 1, wherein the home area is formed at an arbitrary area of the display area.

4. The display device of claim 1, wherein the home integrated circuit comprises at least one of a touch recognition integrated circuit and a fingerprint recognition integrated circuit.

5. The display device of claim 1, wherein the home integrated circuit contacts a back surface of the display panel.

6. The display device of claim 1, wherein the plurality of via holes are positioned between the upper surface of the driving integrated circuit and the bottom surface of the home integrated circuit.

7. The display device of claim 1, wherein the home integrated circuit has a planar area larger than a planar area of the driving integrated circuit on a plane.

8. The display device of claim 1, wherein the home integrated circuit has a planar area substantially equal to a planar area of the driving integrated circuit on a plane.

9. The display device of claim 1, wherein the adhesive member comprises a conductive material.

10. The display device of claim 9, wherein the adhesive member is an anisotropic conductive film (ACF).

11. The display device of claim 1, wherein the driving integrated circuit and the home integrated circuit are unitarily packaged.

12. The display device of claim 1, wherein the home area of the display area has a shape selected from: a substantially quadrangular shape, a substantially triangular shape, a substantially rhombic shape, a substantially circular shape, a substantially elliptical shape, a substantially semicircular shape, a substantially polygonal shape, and a combined shape thereof.

13. The display device of claim 1, wherein a bottom surface of the driving integrated circuit is mounted on the flexible printed circuit board.

* * * * *